United States Patent

[11] 3,588,637

[72] Inventors Robert C. Jaklevic;
John J. Lambe, Birmingham, Mich.

[21] Appl. No. 824,891
[22] Filed May 15, 1969
[45] Patented June 28, 1971
[73] Assignee Ford Motor Company
Dearborn, Mich.

[54] MACROMOLECULAR MEMORY CIRCUIT
6 Claims, 4 Drawing Figs.

[52] U.S. Cl. .......... 317/238, 317/233, 317/234
[51] Int. Cl. .......... H01l 9/00
[50] Field of Search .......... 317/234, 235, 8, 8.1, 237—241

[56] References Cited

UNITED STATES PATENTS

| | | | |
|---|---|---|---|
| 3,056,073 | 9/1961 | Mead | 317/234 |
| 3,116,427 | 12/1963 | Giaever | 317/234X |
| 3,255,393 | 6/1966 | Hutchins IV et al. | 317/234 |
| 3,257,581 | 6/1966 | Lodge et al. | 317/234X |
| 3,321,659 | 5/1967 | Brody | 317/234X |

*Primary Examiner*—James D. Kallam
*Attorneys*—John R. Faulkner and Thomas H. Oster

ABSTRACT: This invention teaches a device incorporating in one very small area a very large number of "macromolecular" circuits. Each of these circuits includes a tunneling resistor in parallel with a small capacitor capable of controlled relaxation and both elements being in series with a further capacitor. This deice at low temperatures serves as a memory element. element.

INVENTORS.
ROBERT C. JAKLEVIC
JOHN J. LAMBE
BY John R. Faulkner
Thomas H. Oster
ATTORNEYS INVENTORS.
ROBERT C. JAKLEVIC
JOHN J. LAMBE
BY John R. Faulkner
Thomas H. Oster
ATTORNEYS

MACROMOLECULAR MEMORY CIRCUIT

THE INVENTION

This invention has been fabricated by assembling approximately one billion ($10^9$) separate circuits upon a chip having a length of 3 mm. and a width of 2 mm. Each of these circuits includes a tunneling resistor in parallel with a small capacitor capable of controlled relaxation and both of these elements as a unit being in series with a further capacitor. The operation of this device is dependent upon capacitors sufficiently small that a measurable voltage may be impressed thereon by the acquisition or loss of a single electronic charge (electron) which is roughly equal to $1.6\times10^{119}$ coulomb.

The structure and operation of this invention is best understood by reference to the drawings in which FIG. 1 is a cross section of the structure upon which this invention is predicated;

Figure 1:
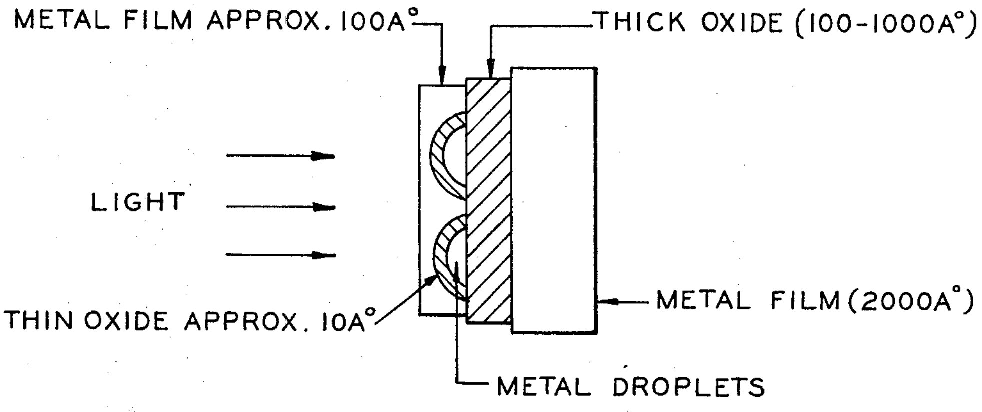

FIG. 1 depicts the structure assembled on a base which is a film of aluminum or tantalum having a noncritical thickness of about 2,000 A. A thick oxide film is placed upon this base by exposure to gaseous or anodic oxidation. This film should be between 100 and 1,000 A. thick. It is critical that this film by thick enough to inhibit tunneling. This thick oxide film is exposed to vaporous metal such as lead, tin, bismuth or indium under vacuum evaporation conditions to place upon the film a large number of discrete and separate metal droplets. These flattened droplets have an average diameter of about 100 A.

The surfaces of these droplets remote from the thick oxide layer are now oxidized to form a thin tunneling barrier. This may be done by simple exposure to the atmosphere. This thin oxide layer has a thickness of about 10 A. The preferred metals for these droplets are indium and tin. Bismuth and lead have also been used. A final thick metal film having a thickness of about 1,000 A. was evaporated over the oxidized droplets to serve as an electrode. The other connection to the system is made through the 2,000 A. thick base of aluminum or tantalum.

Figure 2:
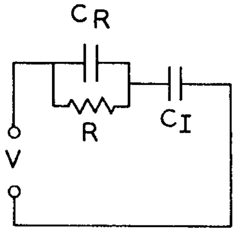
FIG. 2 is a circuit diagram of one individual current path provided by this structure.

A consideration of any single metal drop with its associated oxide films and electrodes will show that each such drop and its associated parts produces in effect a macromolecular circuit as shown in FIG. 2. The thin oxide or tunneling film over the metal droplet forms the dielectric in capacitor $C_R$ and the thick oxide film over the aluminum or tantalum base the dielectric of capacitor $C_I$. The thin oxide film over each metal droplet serves as resistor R which passes current by the tunneling mechanism. The thick oxide layer over the aluminum or tantalum base must be thick enough to inhibit all tunneling. Capacitor $C_R$ must be capable of relaxation in a reasonably short time.

This structure is to be distinguished from that reported by I. Giaever and H.R. Zeller: "Superconductivity of Small Tin Particles Measured by Tunneling," Physical Review Letters, Vol. 20, No. 26, June 24, 1968, pp. 1504—1507, in the inability of the thick oxide layer to permit tunneling.

Figure 3:
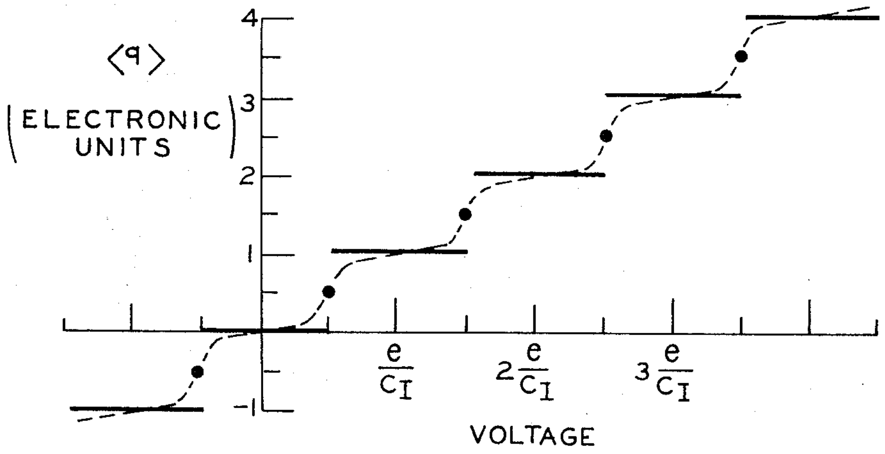
FIG. 3 is a graphical showing of charge variation in $C_I$ with applied voltage.

If the device described above be cooled to the temperature of liquid helium (4.2° K.) and a small voltage V as shown in FIG. 2 applied, the charge upon capacitor $C_I$ will change in a series of discrete steps, with the ascent or descent from one charge level to the other representing the gain or loss of a single electron. This phenomenon has its basis in the fact that the charging of the capacitor $C_I$ is by tunneling through resistance R which is identical with the thin oxide layer of FIG. 1. This current is carried by individual electrons tunneling through this 10 A. thick layer. If this charging process is carried out and the device permitted to warm up, the individual discrete steps shown in the solid lines of FIG. 3 tend to become less distinct and the series of steps degenerates gradually into a smooth line. This represents the thermal agitation of the electrons in the metal.

This device may be used as a memory device by impressing upon it a small direct current voltage, and subsequently measuring the alternating current capacitance of the device after the host of capacitors $C_R$ (FIG. 1) have been permitted to relax by the passage of time, or time assisted by the application of light flux if the components of the device be thin enough to permit the passage of light.

The necessity for this relaxation phenomenon will be appreciated if it is remembered that the charge on capacitor $C_I$ is capable of changing only in discrete units of electrostatic charge, The relaxation of capacitor $C_R$ acts in effect as a voltage vernier and causes the voltage across the thin oxide layer to approach zero.

To employ this structure as a memory device, it is necessary to determine its alternating current capacitance as a function of the applied direct current voltage. This was done at a frequency of 100 kHz. by the techniques well known to the art and described fully in a publication entitled "Rectifying Semiconductor Contacts," H. K. Henisch, Oxford University Press, 1957, pp. 150—156.

Figure 4:
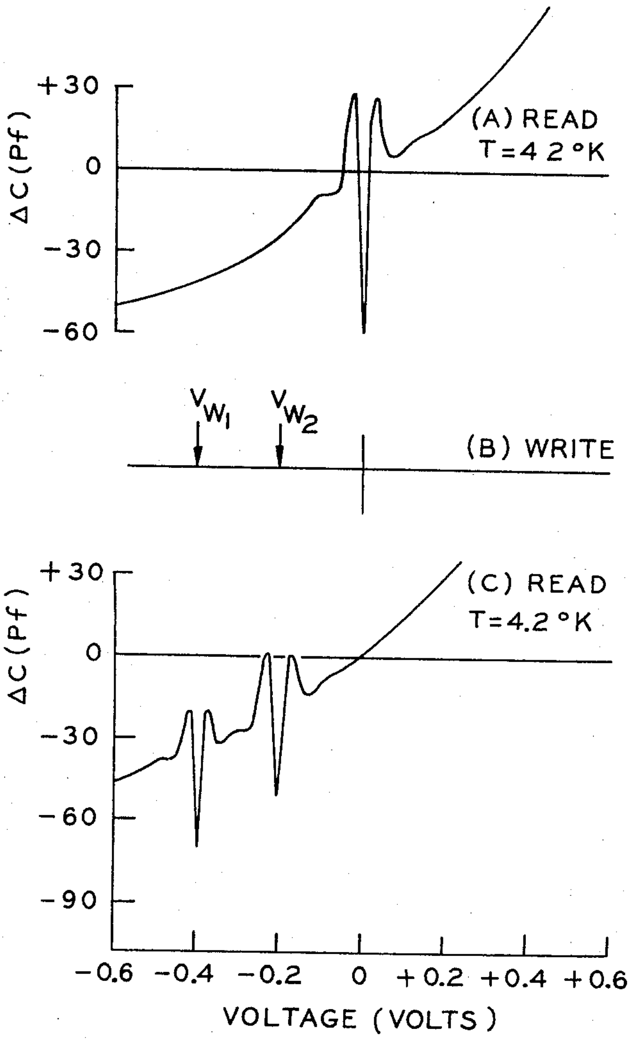
FIG. 4 is a graphical showing of alternating current capacitance change at 100 kHz. as a function of applied voltage.

The upper curve of FIG. 4 represents the ΔC (expressed in picofarads) of the entire assembly of the approximately $10^9$ circuits when cooled to liquid helium temperature and in the absence of any previously applied voltage. Attention is invited to the very sharp dip in the capacitance curve at the zero voltage value of the abscissa. Intermediate the upper and lower curves of FIG. 4 is indicated two voltages $V_w$ and $V_w$ which are applied to the system from a square wave generator. This succession of two voltages $V_w$ and $V_w$ was applied for about 1 minute and at a frequency of 1 Hz. After relaxation was permitted to occur, the alternating current capacitive characteristics of the device were again measured with the results shown in the lower graph of FIG. 4. Note the precise coincidence of the sharp voltage dips of this curve with the values of the applied voltages.

It is important to note and fully understand that the memories at 200 and 400 mv. in FIG. 4 do not mean that any portion of the system is charged to these values. The memory is contained in the phase relationship among the very large number of extremely small capacitors. There is no decay along the voltage axis. The fading of memory implies a blurring out of the phase relationship. It is not necessary that complete alignment of the phase of the capacitors by the relaxation phenomena occur to obtain useful effects. A partial relaxation or alignment will yield a smaller but still discernible effect. Hence it is possible to store a plurality of voltages as memories simultaneously.

It is clear that the polarization or relaxation phenomena which cause phase shift may arise in many different ways. From the work of J.M. Stevels, "Conference on Non-Crystalline Solids," 1958, edited by Van Derck Frechette (John Wiley and Sons, New York, 1960), p. 412, one would expect such processes to occur in amorphous oxides. Such effects will have temperature dependent relaxation times which can become quite long at very low temperatures. One can employ light to free holes and electrons which will produce similar phase shift effects when they are retrapped.

In the above discussion the tunneling layer has been disclosed as an oxide layer. It is to be understood that any known tunneling layer as, for example, a sulfide or nitride layer will function in the same manner.

We claim:

1. An electronic device comprising a comparatively thick conductive base, an oxide layer of about 100—1,000 A. thick deposited upon this thick conductive base for inhibiting electron tunneling therethrough, a plurality of discrete droplets of metal deposited upon this oxide layer, said droplets having a layer of thin insulation of electrons tunnelling thickness upon their surfaces remote from the base, and a metal film conductive member deposited over the thin insulation and droplets of metal.

2. The structure recited in claim 1 in which the final metal conductive film member is of light transmitting thinness for permitting light to flow through the film and upon the tin tunneling insulation layer.

3. The structure recited in claim 1 in which the metal droplets are deposited from a metal selected from the group consisting of tin, indium, bismuth and lead.

4. The structure recited in claim 1 in which the tunneling layer is an oxide layer.

5. The structure recited in claim 1 in which the diameter of the metal droplets is about 100 A.

6. The structure recited in claim 1 in which a rectangular area 3 mm. long and 2 mm. wide has a droplet population of approximately $10^9$.